(12) United States Patent
Sato et al.

(10) Patent No.: US 9,329,490 B2
(45) Date of Patent: May 3, 2016

(54) PATTERN FORMATION METHOD, MASK FOR EXPOSURE, AND EXPOSURE APPARATUS

(71) Applicant: KABUSHIKI KAISHA TOSHIBA, Tokyo (JP)

(72) Inventors: Takashi Sato, Kanagawa-ken (JP); Ryoichi Inanami, Kanagawa-ken (JP); Shinichi Ito, Kanagawa-ken (JP); Satoshi Tanaka, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 215 days.

(21) Appl. No.: 14/095,533

(22) Filed: Dec. 3, 2013

(65) Prior Publication Data

US 2015/0055113 A1    Feb. 26, 2015

(30) Foreign Application Priority Data

Aug. 20, 2013  (JP) ................................. 2013-170794

(51) Int. Cl.
*G03B 27/32*  (2006.01)
*G03F 7/20*  (2006.01)

(52) U.S. Cl.
CPC ........ *G03F 7/70325* (2013.01); *G03F 7/70733* (2013.01)

(58) Field of Classification Search
CPC .......................... G03F 7/70325; G03F 7/70733
USPC .......................................................... 355/72
See application file for complete search history.

(56) References Cited

U.S. PATENT DOCUMENTS

| 8,211,625 | B2 | 7/2012 | Arora et al. | |
| 2002/0021434 | A1* | 2/2002 | Nomura et al. | G03F 7/70641 355/55 |
| 2004/0090194 | A1* | 5/2004 | Gesley | B82Y 10/00 315/500 |
| 2008/0186579 | A1 | 8/2008 | Solak | |

(Continued)

FOREIGN PATENT DOCUMENTS

| JP | S51-120615 A | 10/1976 |
| JP | H06-161092 A | 6/1994 |

(Continued)

OTHER PUBLICATIONS

Sato; "Talbot Effect Immersion Lithography by Self-Imaging of Very Fine Grating Patterns", American Vacuum Society, J. Vac. Sci. Technol. B 30(6), pp. 06FG02-1-06FG02-5, (2012).

(Continued)

*Primary Examiner* — Peter B Kim
(74) *Attorney, Agent, or Firm* — Finnegan, Henderson, Farabow, Garrett & Dunner, LLP

(57) ABSTRACT

According to one embodiment, a pattern formation method includes preparing a mask pattern for interference, producing Talbot interference, and forming a pattern by blocking a part of interference light. The mask pattern for interference is arranged periodically a plurality of light transmissive portions. The Talbot interference is based on a transmitted light. The transmitted light is transmitted through the light transmissive portions by applying a light to the mask pattern for interference. The part of interference light is produced by the Talbot interference by means of a mask pattern for light blocking and applying another part of the interference light transmitted through the mask pattern for light blocking to an exposure object member.

19 Claims, 10 Drawing Sheets

(56) References Cited

U.S. PATENT DOCUMENTS

2011/0199598 A1    8/2011   Solak et al.
2011/0310374 A1   12/2011   Solak et al.
2012/0092634 A1    4/2012   Solak et al.

FOREIGN PATENT DOCUMENTS

| | | |
|---|---|---|
| JP | 10-111409 | 4/1998 |
| JP | 11-008179 | 1/1999 |
| JP | 2000-223400 | 8/2000 |

OTHER PUBLICATIONS

Urbanski et al.; "Defect Tolerant Extreme Ultraviolence Lithography Technique", American Vacuum Society, J. Vac. Sci. Technol. B 30(6), pp. 06F502-1-06F502-5, (2012).

Notification of Reason(s) for Refusal for Japanese Patent Application No. 2013-170794 dated Nov. 4, 2015, issued by Japanese Patent Office (6 pages including translation).

\* cited by examiner

US 9,329,490 B2

PATTERN FORMATION METHOD, MASK FOR EXPOSURE, AND EXPOSURE APPARATUS

CROSS-REFERENCE TO RELATED APPLICATIONS

This application is based upon and claims the benefit of priority from Japanese Patent Application No. 2013-170794, filed on Aug. 20, 2013; the entire contents of which are incorporated herein by reference.

FIELD

Embodiments described herein relate generally to a pattern formation method, a mask for exposure, and an exposure apparatus.

BACKGROUND

A pattern formation method based on the proximity method using Talbot interference can form a fine pattern without using an expensive projection optical system. Talbot interference is a phenomenon in which when coherent light with good coherence is applied to a mask for exposure having a repeating pattern, a reversed image and a self-produced image of the pattern appear periodically in the direction of light traveling. Thus, the reversed image or the self-produced image is utilized to perform pattern transfer. In the pattern formation using Talbot interference, further improvement in exposure accuracy is important.

DETAILED DESCRIPTION

Figure 1:
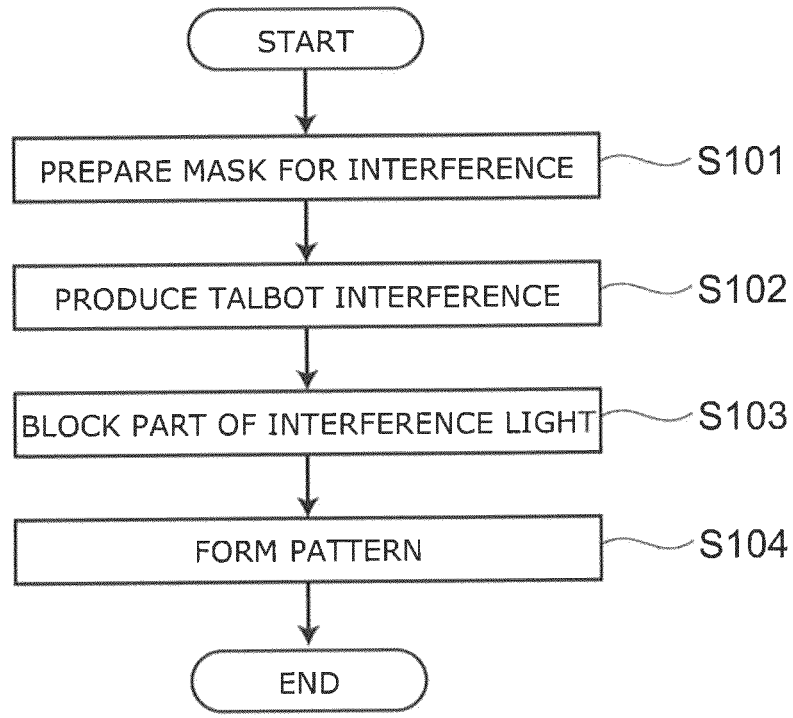
FIG. 1 is a flow chart illustrating a pattern formation method according to a first embodiment.

In general, according to one embodiment, a pattern formation method includes preparing a mask pattern for interference, producing Talbot interference, and forming a pattern by blocking a part of interference light. The mask pattern for interference is arranged periodically a plurality of light transmissive portions. The Talbot interference is based on a transmitted light. The transmitted light is transmitted through the light transmissive portions by applying a light to the mask pattern for interference. The part of interference light is produced by the Talbot interference by means of a mask pattern for light blocking and applying another part of the interference light transmitted through the mask pattern for light blocking to an exposure object member.

Various embodiments will be described hereinafter with reference to the accompanying drawings. In the following description, identical components are marked with the same reference numerals, and a description of components once described is omitted as appropriate.

First Embodiment

FIG. 1 is a flow chart illustrating a pattern formation method according to a first embodiment.

As shown in FIG. 1, the pattern formation method according to the embodiment includes the preparation of a mask for interference (step S101), the production of Talbot interference (step S102), the blocking of part of the interference light (step S103), and the formation of a pattern (step S104).

Figure 2:
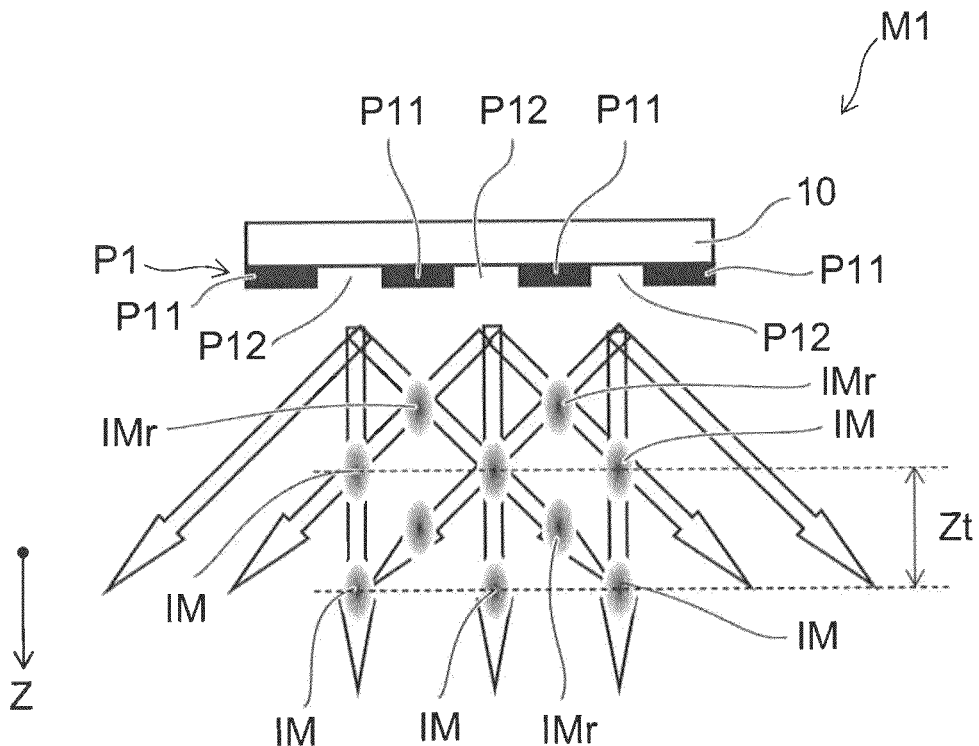
FIG. 2 illustrates Talbot interference produced by the mask for interference M1.

In the preparation of a mask for interference shown in step S101, a mask for interference in which a plurality of light transmissive portions are arranged periodically is prepared. FIG. 2 is a schematic view illustrating a mask for interference. As shown in FIG. 2, a mask for interference M1 includes a substrate 10 that transmits light of a prescribed wavelength and a plurality of first light blocking pattern features P11 and a plurality of light transmissive pattern features P12 provided on the substrate 10. The first light blocking pattern feature P11 blocks the light mentioned above. The light transmissive pattern feature P12 transmits the light mentioned above.

Quartz or synthetic quartz is used for the substrate 10, for example. Chromium (Cr) is used for the first light blocking pattern feature P11, for example.

The plurality of first light blocking pattern features P11 are arranged on the substrate 10 with a prescribed width and a prescribed interval. The plurality of light transmissive pattern features P12 are each provided between first light blocking pattern features P11. Thus, the plurality of light transmissive pattern features P12 are provided periodically on the substrate 10. The plurality of first light blocking pattern features P11 and the plurality of light transmissive pattern features P12 constitute a line-and-space pattern, for example. The plurality of first light blocking pattern features P11 and the plurality of light transmissive pattern features P12 may constitute an island-like pattern. In the preparation of a mask for interference shown in step S101 is included the preparation of a mask pattern for interference.

In the production of Talbot interference shown in step S102, the light mentioned above is applied to the mask for interference M1 to produce Talbot interference based on the transmitted light resulting from the light transmitted through the plurality of light transmissive pattern features P12.

FIG. 2 illustrates Talbot interference produced by the mask for interference M1. The Talbot interference is a phenomenon in which when coherent light with good coherence is applied to the repeating pattern of the mask for interference M1 (the first light blocking pattern features P11 and the light transmissive pattern features P12), a reversed image IMr and a self-produced image IM of the repeating pattern of the mask for interference M1 appear periodically in the direction of light traveling.

To produce Talbot interference, it is necessary that at least the 0th-order light and the ±1st-order light be generated from the light transmissive pattern features P12. The self-produced image IM is produced in positions where all the beams of diffracted light are in the same phase. Here, the self-produced image IM refers to a produced image in which a light intensity distribution corresponding to the light transmissive pattern feature P12 appears. The reversed image IMr refers to a produced image in which a light intensity distribution corresponding to the reversal of the light transmissive pattern feature P12 appears. The interference light produced by Talbot interference includes reversed images IMr and self-produced images IM.

The reversed image IMr and the self-produced image IM appear alternately and periodically in the direction of light traveling in a direction away from the mask for interference M1 (the Z-direction). Here, the length of one period in the Z-direction for the self-produced image IM is the Talbot distance $Z_T$.

When the pitch p of the plurality of light transmissive pattern features P12 is near the wavelength of light λ, $Z_T$ is expressed by Mathematical Formula 1.

$$z_T = \frac{p^2}{\lambda}\left(1 + \sqrt{1 - \left(\frac{\lambda}{p}\right)^2}\right)$$ [Mathematical Formula 1]

When the pitch p of the plurality of light transmissive pattern features P12 is twice or more the wavelength of light λ, $Z_T$ is approximately expressed by Mathematical Formula 2.

$$z_T \approx \frac{2p^2}{\lambda}, \quad p \gg \lambda$$ [Mathematical Formula 2]

The pitch Pt in a direction orthogonal to the Z-direction of the self-produced image IM or the reversed image IMr satisfies Pt>λ/n, where n is the refractive index of the medium and λ is the wavelength of light.

Figure 3:
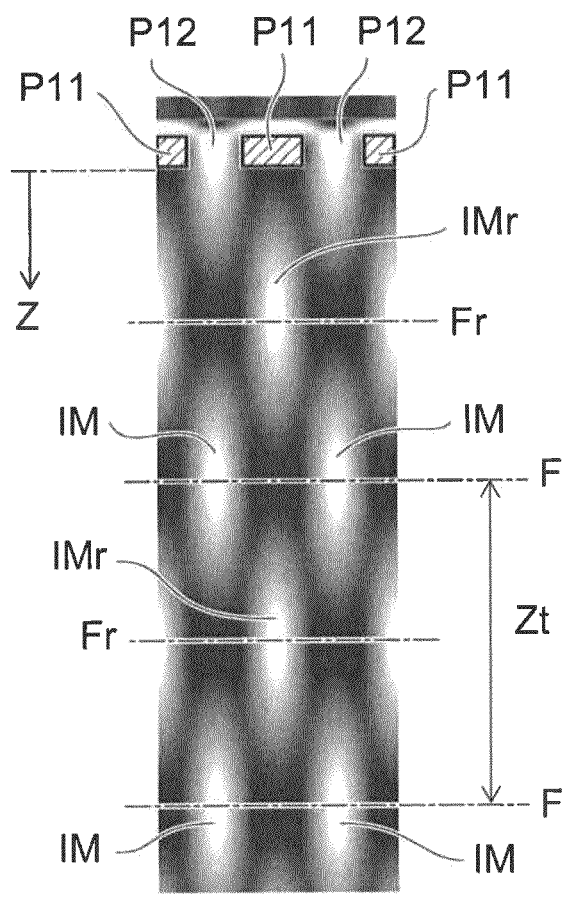
FIG. 3 is a diagram showing a simulation result illustrating a light intensity distribution produced by Talbot interference.

FIG. 3 is a diagram showing a simulation result illustrating a light intensity distribution produced by Talbot interference.

FIG. 3 shows the first light blocking pattern feature P11 and the light transmissive pattern feature P12, and the light intensity distribution is shown by gray scale. The gray scale shows that as the color becomes nearer to white, the light intensity becomes stronger. In FIG. 3, a light intensity distribution with consideration of only the 1st-order diffracted light is shown for convenience of description.

As shown in FIG. 3, a reversed image IMr and a self-produced image IM appear alternately in the Z-direction with the position of the lower end of the first light blocking pattern feature P11 as a reference, for example. Here, of the planes orthogonal to the Z-direction, a plane including the center of the reversed image IMr is referred to as a reversed image plane Fr, and a plane including the center of the self-produced image IM is referred to as a self-produced image plane F.

Figure 4:
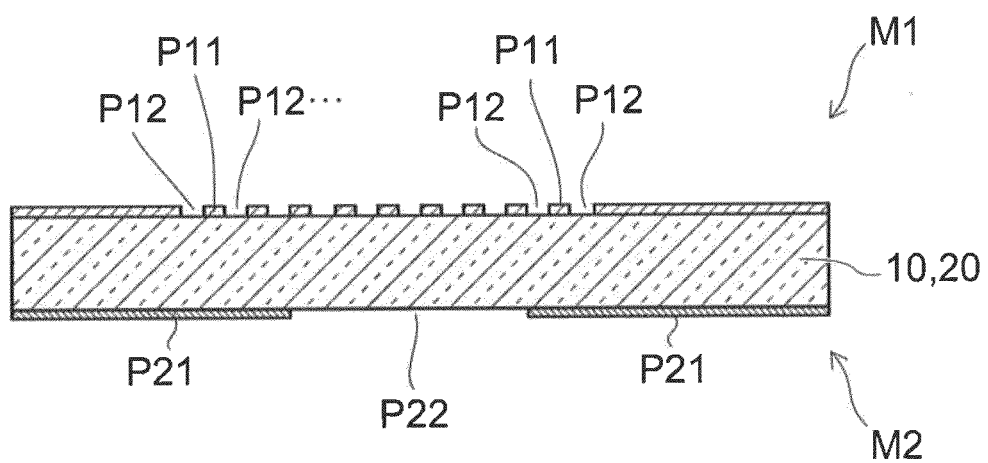
FIG. 4 is a schematic cross-sectional view illustrating a mask for light blocking.

In the blocking of part of the interference light shown in step S103, part of the interference light produced by Talbot interference is blocked by a mask for light blocking. FIG. 4 is a schematic cross-sectional view illustrating a mask for light blocking. FIG. 4 shows a mask for light blocking M2 and the mask for interference M1. FIG. 4 shows an example in which the substrate 10 of the mask for interference M1 is provided integrally with a substrate 20 of the mask for light blocking M2.

The mask for light blocking M2 includes the substrate 20 and a second light blocking pattern feature P21 provided on the substrate 20. In the mask for light blocking M2, the substrate 20 transmits interference light produced by Talbot interference. The second light blocking pattern feature P21 blocks interference light produced by Talbot interference. The portion not blocked by the second light blocking pattern feature P21 is the portion of a light transmissive pattern feature P22. The light transmissive pattern feature P22 transmits interference light produced by Talbot interference.

In the formation of a pattern shown in step S104, the interference light transmitted through the mask for light blocking M2 is applied to an exposure object member, and a pattern is formed on the exposure object member. The exposure object member is a photosensitive material (resist), for example. The pattern includes a pattern obtained by etching an underlayer (a semiconductor wafer, a semiconductor layer, etc.) using a patter formed on a resist or a resist pattern as a mask.

In the pattern formation method according to the embodiment, unnecessary portions of the interference light produced by Talbot interference are cut, and necessary portions are selected and applied to an object to be exposed. Of the interference light produced by Talbot interference, a portion where periodicity is not preserved may occur, for example. In the embodiment, such a portion where periodicity is not preserved is cut, and a portion where periodicity is preserved is applied to the object to be exposed. Thereby, a pattern with high accuracy is formed.

Next, specific light blocking is described.

Figure 5:
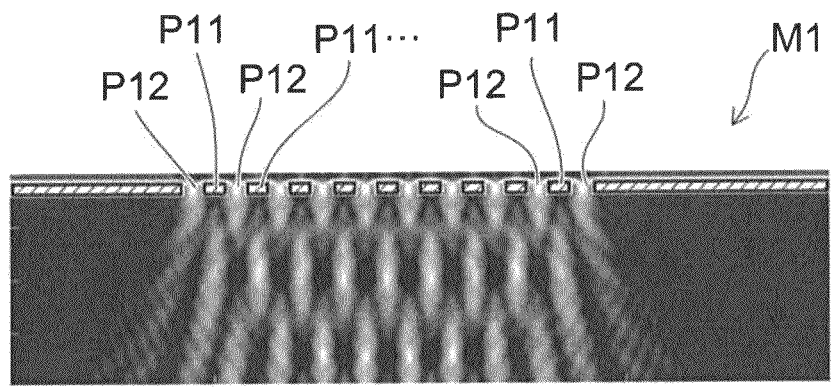
FIG. 5 is a diagram illustrating a simulation result of the intensity distribution of interference light produced by Talbot interference.

FIG. 5 is a diagram illustrating a simulation result of the intensity distribution of interference light produced by Talbot interference.

FIG. 5 shows the first light blocking pattern feature P11 and the light transmissive pattern feature P12, and the light intensity distribution is shown by gray scale. The gray scale shows that as the color becomes nearer to white, the light intensity becomes stronger.

As shown in FIG. 5, a plurality of reversed images IMr and a plurality of self-produced images IM are produced by Talbot interference using the mask for interference M1. A pattern formation method based on the proximity method using interference light produced by Talbot interference has a feature in which even when a master plate (mask) has a defect, the defect is less likely to be transferred. Thus, the proximity exposure method utilizing Talbot interference is expected to enable pattern formation with a low level of defects and with high resolution by a simple exposure method not using a projection optical system.

The following are reference documents on pattern transfer in semiconductor lithography:

i. Sato, Takashi, "Talbot effect immersion lithography by self-imaging of very fine grating patterns." Journal of Vacuum Science & Technology B: Microelectronics and Nanometer Structures 30. 6 (2012): 06FG02-06FG02.

ii. Urbanski, Lukasz, et al. "Defect tolerant extreme ultraviolet lithography technique," Journal of Vacuum Science & Technology B: Microelectronics and Nanometer Structures 30. 6 (2012): 06F502-06F502.

On the other hand, as shown in FIG. 5, of the periodic repetition of the plurality of reversed images IMr and the plurality of self-produced images IM produced by Talbot interference using the mask for interference M1, portions where periodicity is lost exist. For example, periodicity becomes more likely to be lost with proximity to the end of the interference light. If the reversed image IMr and the self-produced image IM in such portions where periodicity is lost are used, a reduction in the accuracy of the pattern formed is caused. In the embodiment, portions of the interference light where periodicity is lost are blocked.

Figure 6:
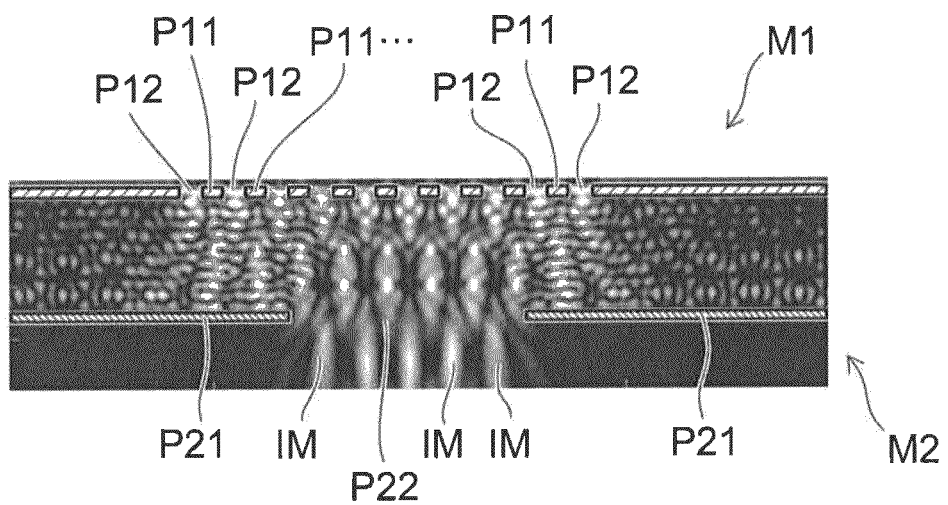
FIG. 6 is a diagram illustrating a simulation result of the intensity distribution of interference light when a mask for light blocking is used.

FIG. 6 is a diagram illustrating a simulation result of the intensity distribution of interference light when a mask for light blocking is used.

FIG. 6 shows the first light blocking pattern feature P11, the light transmissive pattern feature P12, the second light blocking pattern feature P21, and the light transmissive pattern feature 22, and the light intensity distribution is shown by gray scale.

As shown in FIG. 6, when the mask for light blocking M2 is disposed in the direction of travel of the interference light of the mask for interference M1, part of the interference light is blocked by the mask for light blocking M2. The periodicity of the repetition of the interference light transmitted through the mask for light blocking M2 is good.

The spacing between the mask for interference M1 and the mask for light blocking M2 is not less ¼ and not more than ¾ of the Talbot distance $Z_T$. In the embodiment, the mask for light blocking M2 is disposed between the reversed image plane Fr and the self-produced image plane F in the Z-direction, for example.

In the example shown in FIG. 6, self-produced images IM corresponding to three light transmissive pattern features P12 on the left side and two light transmissive pattern features P12 on the right side of the mask for interference M1 are blocked by the second light blocking pattern features P21 of the mask for light blocking M2. The five self-produced images IM transmitted through the mask for light blocking M2 have good periodicity.

Although in the example shown in FIG. 6 part of the plurality of self-produced images IM are blocked and the other parts are allowed to be transmitted, it is also possible to block part of the plurality of reversed images IMr and allow the other parts to be transmitted. The object to be blocked out of the self-produced images IM and the reversed images IMr is selected in accordance with the position in the Z-direction of the mask for light blocking M2.

In the embodiment, it is sufficient that at least one self-produced image IM or at least one reversed image IMr out of the interference light generated by the mask for interference M1 be blocked by the mask for light blocking M2.

The spacing between the mask for light blocking M2 and the exposure object member is preferably less than the Talbot distance $Z_T$. The interference light transmitted through the mask for light blocking M2 repeats the self-produced image IM and the reversed image IMr alternately in a direction away from the mask for light blocking M2 (the Z-direction). When the spacing between the mask for light blocking M2 and the exposure object member is set less than the Talbot distance $Z_T$, self-produced images IM or reversed images IMr that appear first out of the interference light that is transmitted through the mask for light blocking M2 and repeats the self-produced image IM and the reversed image IMr alternately are applied to the exposure object member. Thereby, a pattern in which periodicity is lost and consequently sufficient transfer accuracy for the positions and dimensions of the pattern is not obtained is not transferred, and only a pattern with good transfer accuracy is allowed to be transferred.

In the pattern formation method according to the embodiment, a pattern is formed by applying self-produced images IM or reversed images IMr transmitted through the mask for light blocking M2 to an exposure object member. The self-produced images IM or the reversed images IMr have good periodicity in a direction orthogonal to the Z-direction. Furthermore, the image of a pattern defect included in the mask for interference M1 is less likely to be transferred to the exposure object member due to Talbot interference. Thus, a pattern with high accuracy can be formed using interference light produced by Talbot interference.

When periodicity cannot be sufficiently ensured by simply blocking part of the interference light using the mask for light blocking M2, the dimensions of the first light blocking pattern feature P11 and the light transmissive pattern feature P12 of the mask for interference M1 may be adjusted to apply what is called optical proximity correction (OPC) to maintain the necessary accuracy.

Second Embodiment

Next, masks for exposure according to a second embodiment are described.

Figure 7A:
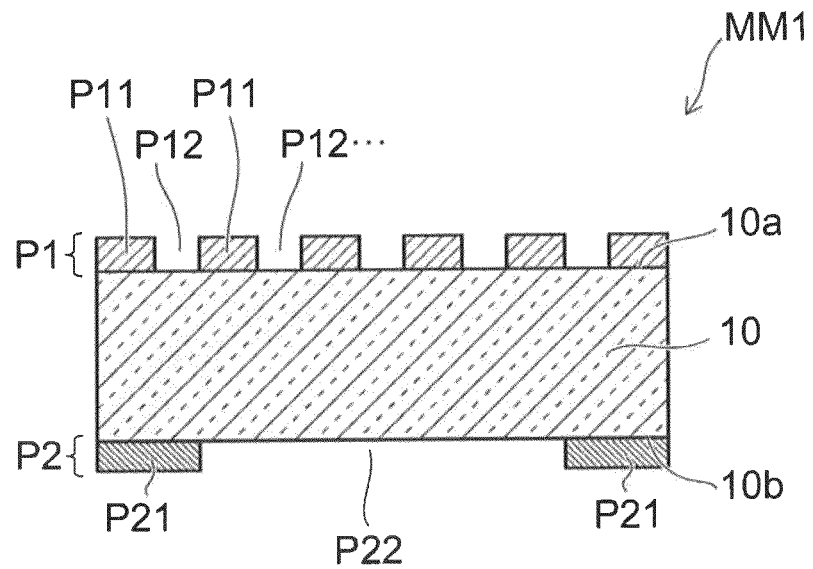
FIG. 7A and FIG. 7B are schematic cross-sectional views illustrating masks for exposure.
Figure 7B:
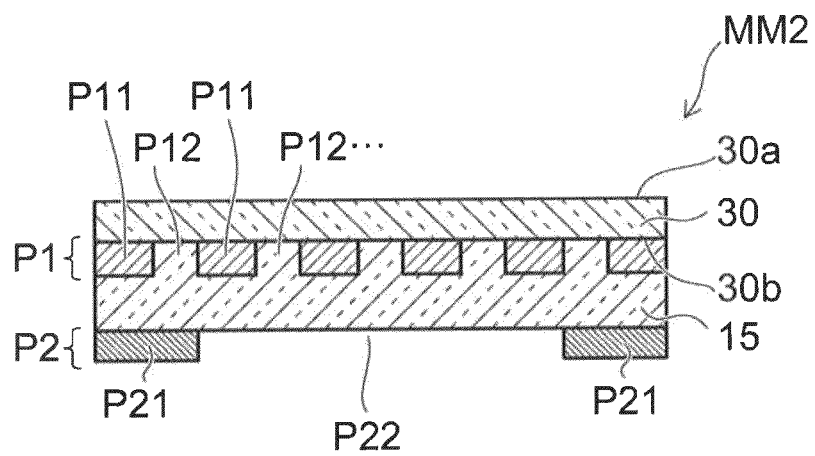

FIG. 7A and FIG. 7B are schematic cross-sectional views illustrating masks for exposure.

FIG. 7A shows a mask for exposure MM1, and FIG. 7B shows a mask for exposure MM2.

The mask for exposure MM1 shown in FIG. 7A includes the substrate 10, a mask pattern for interference P1, and a mask pattern for light blocking P2. The substrate 10 has a first surface 10a and a second surface 10b on the opposite side to the first surface 10a. The substrate 10 transmits light of a prescribed wavelength. Quartz or synthetic quartz is used for the substrate 10, for example.

The mask pattern for interference P1 is provided on the first surface 10a of the substrate 10. The mask pattern for interference P1 generates interference light produced by Talbot interference. The mask pattern for interference P1 has a plurality of first light blocking pattern features P11 and a plurality of light transmissive pattern features P12. The first light blocking pattern feature P11 blocks the light mentioned above. The light transmissive pattern feature P12 transmits the light mentioned above.

The plurality of first light blocking pattern features P11 are arranged on the substrate 10 with a prescribed width and a prescribed interval. The plurality of light transmissive pattern features P12 are each provided between first light blocking pattern features P11. Thereby, the plurality of light transmissive pattern features P12 are provided periodically on the substrate 10.

The plurality of first light blocking pattern features P11 and the plurality of light transmissive pattern features P12 constitute a line-and-space pattern, for example. The plurality of first light blocking pattern features P11 and the plurality of light transmissive pattern features P12 may constitute an island-like pattern.

Cr, chromium oxynitride (CrON), and a stacked film of these are used for the first light blocking pattern feature P11, for example. The plurality of first light blocking pattern features P11 are formed on the first surface 10a of the substrate 10 by photolithography and etching, for example.

The mask pattern for light blocking P2 is provided on the second surface 10b of the substrate 10. The mask pattern for light blocking P2 has the second light blocking pattern feature P21 and the light transmissive pattern feature P22. The second light blocking pattern feature P21 and the light transmissive pattern feature P22 may each be provided in plural.

Cr, CrON, and a stacked film of these are used for the second light blocking pattern feature P21, for example. The second light blocking pattern feature P21 is formed on the second surface 10b of the substrate 10 by photolithography and etching, for example.

The second light blocking pattern feature P21 is provided so as to overlap with part of the mask pattern for interference P1 as viewed in a direction connecting the first surface 10a and the second surface 10b of the substrate 10. The second light blocking pattern feature P21 blocks part of the interference light generated by the mask pattern for interference P1.

In the mask for exposure MM1, the spacing between the mask pattern for interference P1 and the mask pattern for light blocking P2 is defined by the thickness of the substrate 10. When light of a prescribed wavelength is applied from the mask pattern for interference P1 side of the mask for exposure MM1, interference light produced by Talbot interference is generated by the mask pattern for interference P1. Part of the interference light is blocked by the mask pattern for light blocking P2. The other parts of the interference light are transmitted through the mask pattern for light blocking P2. By disposing an exposure object member on the mask pattern for light blocking P2 side of the mask for exposure MM1, the interference light transmitted through the mask pattern for light blocking P2 is applied to the exposure object member. Thereby, a pattern is formed on the exposure object member.

In the mask for exposure MM1, since the substrate 10 is provided between the mask pattern for interference P1 and the mask pattern for light blocking P2, the spacing between the mask pattern for interference P1 and the mask pattern for light blocking P2 can be set accurately by the substrate 10.

The mask for exposure MM2 shown in FIG. 7B includes a substrate 30, the mask pattern for interference P1, the mask pattern for light blocking P2, and an intermediate film 15. The substrate 30 has a first surface 30a and a second surface 30b on the opposite side to the first surface 30a. The substrate 30 transmits light of a prescribed wavelength. Quartz or synthetic quartz is used for the substrate 30, for example.

The mask pattern for interference P1 is provided on the second surface 30b of the substrate 30. The mask pattern for interference P1 generates interference light produced by Talbot interference. The mask pattern for interference P1 has a plurality of first light blocking pattern features P11 and a plurality of light transmissive pattern features P12. The shapes of the first light blocking pattern feature P11 and the light transmissive pattern feature P12 and the material of the first light blocking pattern feature P11 are similar to those of the mask for exposure MM1.

The mask pattern for light blocking P2 is provided on the second surface 30b side of the substrate 30. The mask pattern for light blocking P2 has the second light blocking pattern feature P21 and the light transmissive pattern feature P22. The second light blocking pattern feature P21 and the light transmissive pattern feature P22 may each be provided in plural.

The second light blocking pattern feature P21 is provided so as to overlap with part of the mask pattern for interference P1 as viewed in a direction connecting the first surface 30a and the second surface 30b of the substrate 30. The second light blocking pattern feature P21 blocks part of the interference light generated by the mask pattern for interference P1. The shapes of the second light blocking pattern feature P21 and the light transmissive pattern feature P22 and the material of the second light blocking pattern feature P21 are similar to those of the mask for exposure MM1.

The intermediate film 15 is provided between the mask pattern for interference P1 and the mask pattern for light blocking P2. The intermediate film 15 transmits light of a prescribed wavelength similarly to the substrate 30. Silicon oxide ($SiO_2$) is used for the intermediate film 15, for example.

To manufacture the mask for exposure MM2, first, Cr or a stacked film of Cr and CrON is formed on the second surface 30b of the substrate 30, and photolithography and etching are performed to form the mask pattern for interference P1. Next, $SiO_2$ or the like is stacked so as to cover the mask pattern for interference P1, and the surface is planarized to form the intermediate film 15. Next, Cr or a stacked film of Cr and CrON is formed on the intermediate film 15, and photolithography and etching are performed to form the mask pattern for light blocking P2. Thereby, the mask for exposure MM2 is completed.

In the mask for exposure MM2, when light of a prescribed wavelength is applied from the mask pattern for interference P1 side, interference light produced by Talbot interference is generated by the mask pattern for interference P1. Part of the interference light is blocked by the mask pattern for light blocking P2. The other parts of the interference light are transmitted through the mask pattern for light blocking P2. By disposing an exposure object member on the mask pattern for light blocking P2 side of the mask for exposure MM2, the interference light transmitted through the mask pattern for light blocking P2 is applied to the exposure object member. Thereby, a pattern is formed on the exposure object member.

In the mask for exposure MM1, the spacing between the mask pattern for interference P1 and the mask pattern for light blocking P2 is defined by the thickness of the intermediate film 15. The thickness of the intermediate film 15 is made very thin by the conditions when the material of the intermediate film 15 (e.g. $SiO_2$) is deposited. The substrate 30 serves as a support member of the mask pattern for interference P1, the intermediate film 15, and the mask pattern for light blocking P2. In the mask for exposure MM2, the spacing between the mask pattern for interference P1 and the mask pattern for light blocking P2 can be set thin and accurately by the thickness of the intermediate film 15. Furthermore, the total thickness of the mask for exposure MM2 can be made thin.

On the masks for exposure MM1 and MM2, an alignment mark for alignment with an exposure apparatus and an exposure object member (e.g. a wafer) may be provided beforehand. Similarly, marks may be provided on the masks for exposure MM1 and MM2 for various purposes.

Third Embodiment

Next, a pattern formation method according to a third embodiment is described.

Figure 8:
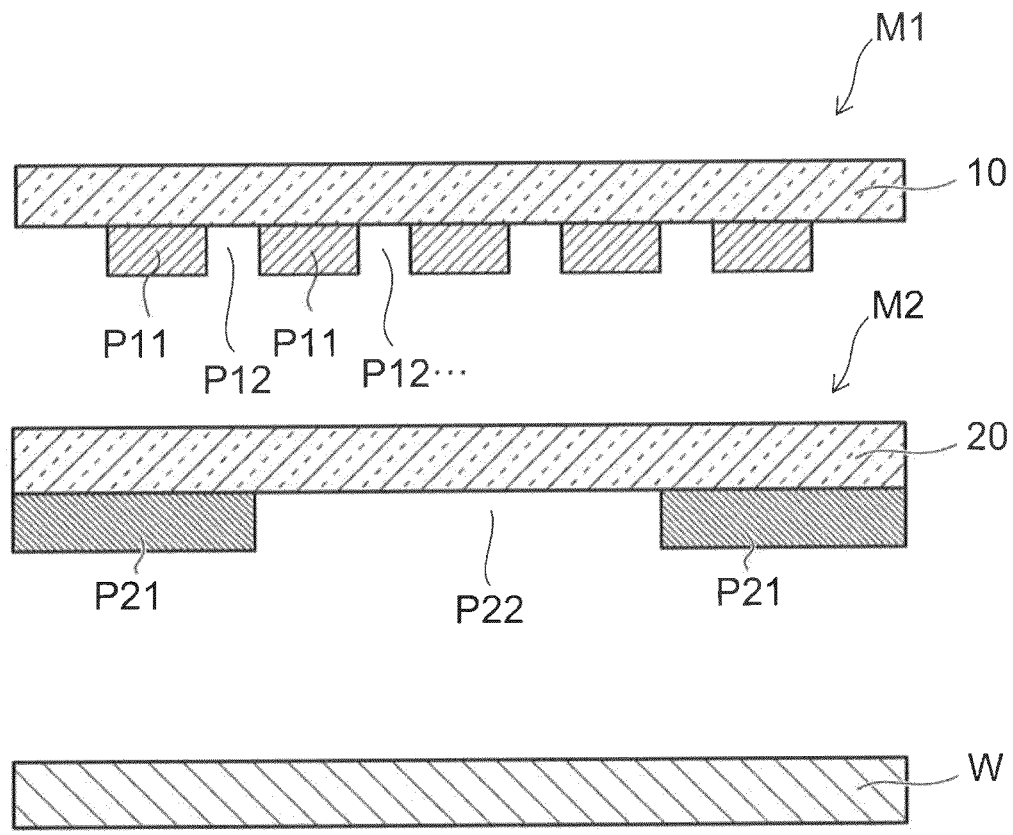
FIG. 8 is a schematic cross-sectional view illustrating a pattern formation method according to the third embodiment.

FIG. 8 is a schematic cross-sectional view illustrating a pattern formation method according to the third embodiment.

The pattern formation method according to the embodiment is a method in which the relative positions of the mask for interference M1 and the mask for light blocking M2 are changed in the formation of a pattern shown in step S104 of FIG. 1.

As shown in FIG. 8, in the embodiment, the mask for interference M1 is provided separately from the mask for light blocking M2. That is, the mask for interference M1 includes the substrate 10 and the first light blocking pattern feature P11 and the light transmissive pattern feature P12 provided on one surface of the substrate 10. The mask for light blocking M2 includes the substrate 20 and the second light blocking pattern feature P21 and the light transmissive pattern feature P22 provided on one surface of the substrate 20. In such a configuration, the following three are given as the relative positional relationships between the mask for interference M1, the mask for light blocking M2, and a wafer (an exposure object member) W:

1. First positional relationships are fixing the relative positional relationship between the mask for interference M1 and the mask for light blocking M2 and moving the relative positional relationship between the mask for interference M1 and the mask for light blocking M2, and the wafer W.

2. Second positional relationships are fixing the relative positional relationship between the mask for interference M1 and the wafer W and moving the relative positional relationship between the mask for interference M1 and the wafer W, and the mask for light blocking M2.

3. Third positional relationship are fixing the relative positional relationship between the mask for light blocking M2 and the wafer W and moving the relative positional relationship between the mask for interference M1 and the wafer W, and the mask for light blocking M2.

The "moving" in the positional relationships of items 1 to 3 above includes a rectilinear motion along the surface of the wafer W and a rotational motion along the surface of the wafer W.

In the first positional relationships of item 1 above, first, interference light selected by the mask for interference M1 and the mask for light blocking M2 is applied onto the wafer W. After the application, the relative positional relationship between the mask for interference M1 and the mask for light blocking M2, and the wafer W is moved. For example, the wafer W is moved rectilinearly by a prescribed pitch along the surface of the wafer W. After that, interference light selected by the mask for interference M1 and mask for light blocking M2 is applied onto the wafer W. By repeating this processing, a pattern is formed on a large area of the surface of the wafer W.

In the first positional relationships of item 1 above, the relative positional relationship between the mask for interference M1 and the mask for light blocking M2, and the wafer W may be rotated by, for example, 90 degrees along the surface of the wafer W. In the case of using a mask for interference M1 forming lines and spaces, a pattern corresponding to the multiple exposure by the exposures before and after the rotation by 90 degrees is formed on the wafer W, for example.

In the second positional relationships of item 2 above, first, interference light selected by the mask for interference M1 and the mask for light blocking M2 is applied onto the wafer W. After the application, the relative positional relationship between the mask for interference M1 and the wafer W, and the mask for light blocking M2 is moved. For example, the mask for light blocking M2 is moved rectilinearly by a prescribed pitch along the surface of the wafer W. After that, interference light selected by the mask for interference M1 and the mask for light blocking M2 is applied onto the wafer W. Thereby, patterns are formed in different regions on the wafer W by the first exposure and the next exposure.

In the third positional relationships of item 3 above, first, interference light selected by the mask for interference M1 and the mask for light blocking M2 is applied onto the wafer W. After the application, the relative positional relationship between the mask for interference M1 and the wafer W, and the mask for light blocking M2 is moved. For example, the mask for interference M1 is moved rectilinearly by a prescribed pitch along the surface of the wafer W. After that, interference light selected by the mask for interference M1 and the mask for light blocking M2 is applied onto the wafer W. Thereby, beams of interference light of different patterns of the mask for interference M1 are multiply applied to the same region on the wafer W by multiple exposure.

In the third positional relationships of item 3 above, the relative positional relationship between the mask for interference M1 and the wafer W, and the mask for light blocking M2 may be rotated by, for example, 90 degrees along the surface of the wafer W. In the case of using a mask for interference M1 forming lines and spaces, a pattern corresponding to the multiple exposure by the exposures before and after the rotation by 90 degrees is formed on the wafer W, for example.

Fourth Embodiment

Next, a pattern formation method according to a fourth embodiment is described.

Figure 9:
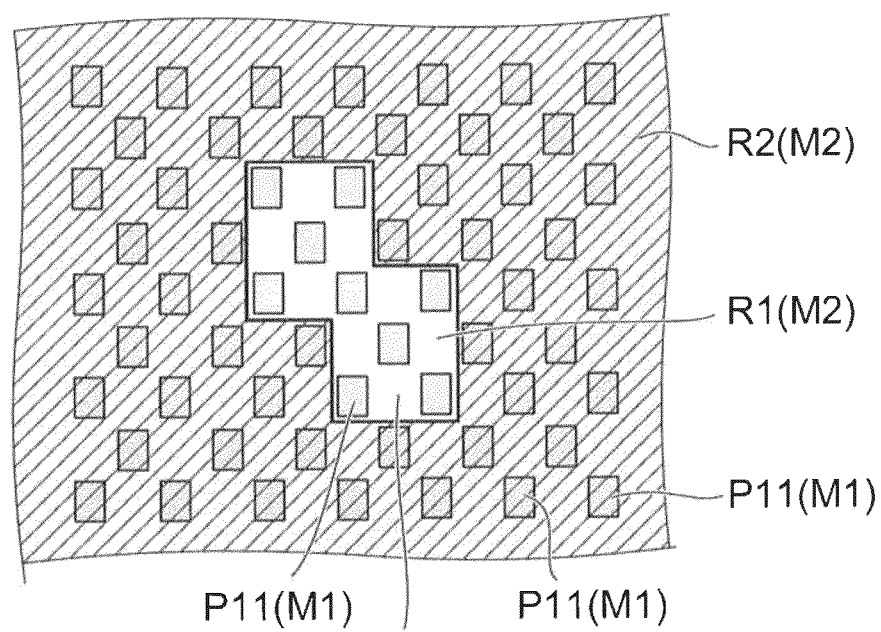
FIG. 9 is a schematic plan view illustrating a pattern formation method according to the fourth embodiment.

FIG. 9 is a schematic plan view illustrating a pattern formation method according to the fourth embodiment.

In FIG. 9, the region where interference light generated by the mask for interference M1 is blocked is shown by slanted lines for convenience of description. In the embodiment, a pattern is formed in an arbitrary region by the superposition of the pattern of the mask for interference M1 and the pattern of the mask for light blocking M2.

The mask for light blocking M2 includes a light blocking region R1 and a light transmissive region R2. The light blocking region R1 blocks interference light produced by Talbot interference formed by the mask for interference M1. The light transmissive region R2 transmits interference light. Thereby, of the interference light, only the interference light transmitted through the light transmissive region R2 is applied to an exposure object member. The region to be irradiated with interference light is determined arbitrarily by the configuration of the light transmissive region R2.

Fifth Embodiment

Next, pattern formation methods according to a fifth embodiment are described.

FIG. 10A to FIG. 12D are schematic views illustrating pattern formation methods according to the fifth embodiment.

FIG. 10A to FIG. 10D show a first example, FIG. 11A to FIG. 11D show a second example, and FIG. 12A to FIG. 12D show a third example.

First, the first example is described.

Figure 10A:
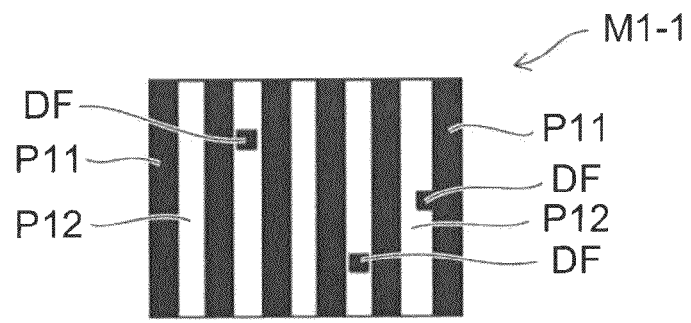
FIG. 10A to FIG. 12D are schematic views illustrating pattern formation methods according to the fifth embodiment.

FIG. 10A shows a mask for interference M1-1. The mask for interference M1-1 has first light blocking pattern features P11 and light transmissive pattern features P12 in a line configuration. Defects DF are included in light transmissive pattern features P12 of the mask for interference M1-1.

Figure 10B:
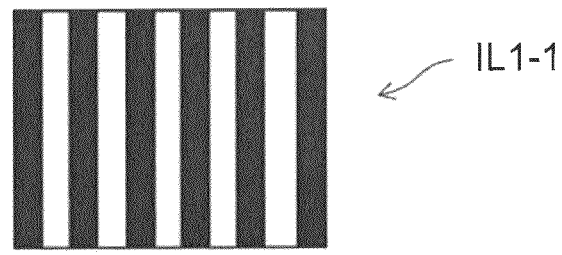

FIG. 10B shows interference light IL1-1 produced by Talbot interference. In the interference light IL1-1 produced by Talbot interference, the image of the defect DF shown in FIG. 10A is suppressed.

Figure 10C:
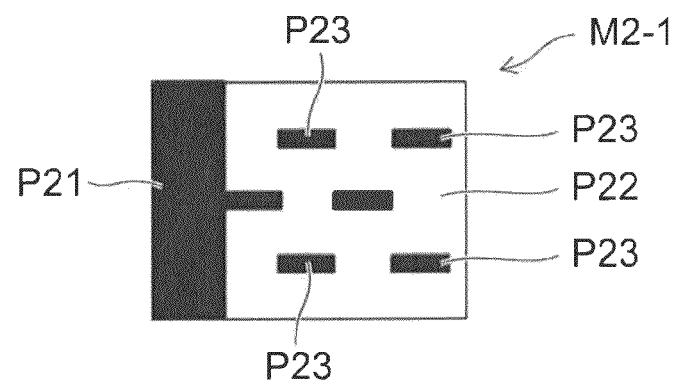

FIG. 10C shows a mask for light blocking M2-1. The mask for light blocking M2-1 has a second light blocking pattern feature P21, a light transmissive pattern feature P22, and third light blocking pattern features P23. The second light blocking pattern feature P21 blocks part of the interference light IL1-1 of Talbot interference formed by the mask for interference M1-1. The second light blocking pattern feature P21 blocks a part of the interference light IL1-1 where periodicity is lost, for example. The third light blocking pattern features P23 selectively block other parts of the interference light IL1-1 (parts of the interference light IL1-1 not blocked by the second light blocking pattern feature P21).

Figure 10D:
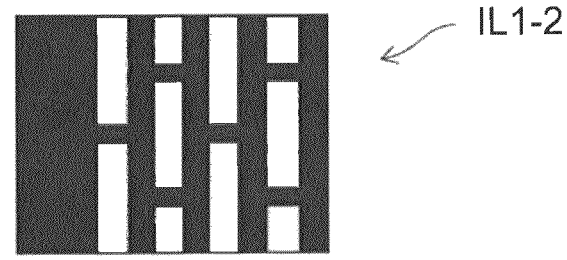

FIG. 10D shows a pattern of interference light IL1-2 applied onto an exposure object member. The pattern of the interference light IL1-2 shown in FIG. 10D is formed by the superposition of the pattern of the interference light IL1-1 produced by Talbot interference shown in FIG. 10B and the mask for light blocking M2-1 shown in FIG. 10C. That is, of the interference light IL1-1 shown in FIG. 10B, the light transmitted through the portions other than the second light blocking pattern feature P21 and the third light blocking pattern features P23 of the mask for light blocking M2-1 shown in FIG. 10C (the light transmissive pattern feature P22) is the pattern of the interference light IL1-2 applied onto the exposure object member (FIG. 10D).

Next, the second example is described.

Figure 11A:
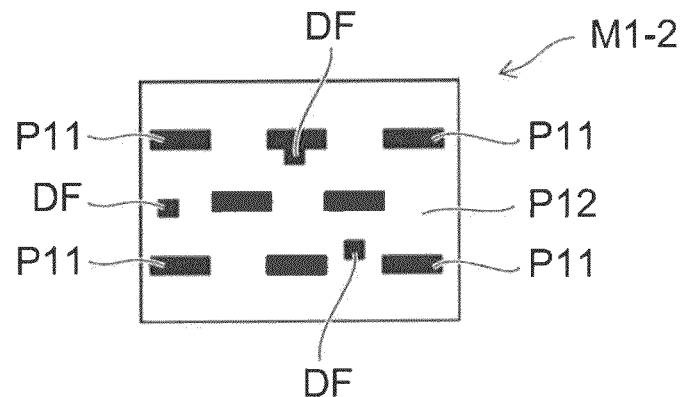

FIG. 11A shows a mask for interference M1-2. The mask for interference M1-2 has a light transmissive pattern feature P12 and island-like first light blocking pattern features P11 arranged in the light transmissive pattern feature P12. Defects DF are included in the light transmissive pattern feature P12 of the mask for interference M1-2.

Figure 11B:
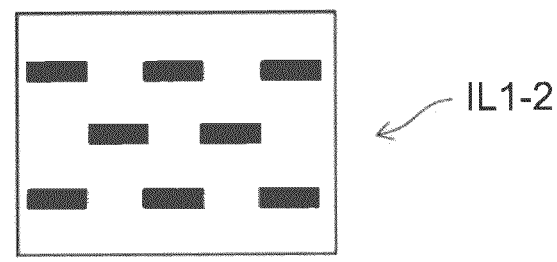

FIG. 11B shows interference light IL2-1 produced by Talbot interference. In the interference light IL2-1 produced by Talbot interference, the image of the defect DF shown in FIG. 11A is suppressed.

Figure 11C:
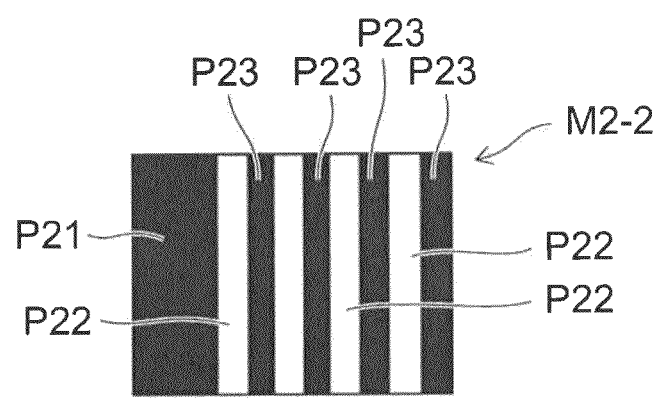

FIG. 11C shows a mask for light blocking M2-2. The mask for light blocking M2-2 has a second light blocking pattern feature P21, light transmissive pattern features P22, and third light blocking pattern features P23. The second light blocking pattern feature P21 blocks part of the interference light IL2-1 of Talbot interference formed by the mask for interference M1-2. The second light blocking pattern feature P21 blocks a part of the interference light IL2-1 where periodicity is lost, for example. The third light blocking pattern features P23 selectively block other parts of the interference light IL2-1 (parts of the interference light IL2-1 not blocked by the second light blocking pattern feature P21).

Figure 11D:
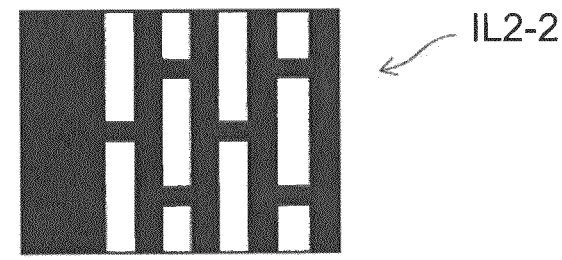

FIG. 11D shows a pattern of interference light IL2-2 applied onto an exposure object member. The pattern of the interference light IL2-2 shown in FIG. 11D is formed by the superposition of the pattern of the interference light IL2-1 produced by Talbot interference shown in FIG. 11B and the mask for light blocking M2-2 shown in FIG. 11C. That is, of the interference light IL2-1 shown in FIG. 11B, the light transmitted through the portions other than the second light blocking pattern feature P21 and the third light blocking pattern features P23 of the mask for light blocking M2-2 shown in FIG. 11C (the light transmissive pattern features P22) is the pattern of the interference light IL2-2 applied onto the exposure object member (FIG. 11D).

The pattern of the interference light IL1-2 shown in FIG. 10D is the same as the pattern of the interference light IL2-2 shown in FIG. 11D. In regard to which of the first example and the second example is to be used, an example out of the masks for interference M1-1 and M1-2 may be selected whereby the correction of the defect DF is made easily. Also an example out of the masks for light blocking M2-1 and M2-2 may be selected whereby the second light blocking pattern feature P21, the light transmissive pattern feature P22, and the third light blocking pattern feature P23 can be formed with good accuracy.

Next, the third example is described.

Figure 12A:
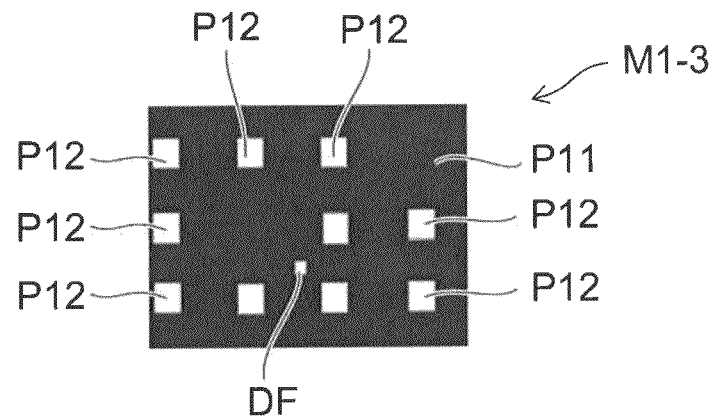

FIG. 12A shows a mask for interference M1-3. The mask for interference M1-3 has a first light blocking pattern feature P11 and island-like light transmissive pattern features P12 arranged in the first light blocking pattern feature P11. A defect DF is included in the first light blocking pattern feature P11 of the mask for interference M1-3.

Figure 12B:
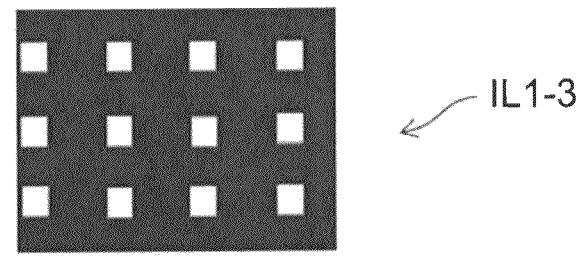

FIG. 12B shows interference light IL1-3 produced by Talbot interference. In the interference light IL1-3 produced by Talbot interference, the image of the defect DF shown in FIG. 12A is suppressed.

Figure 12C:
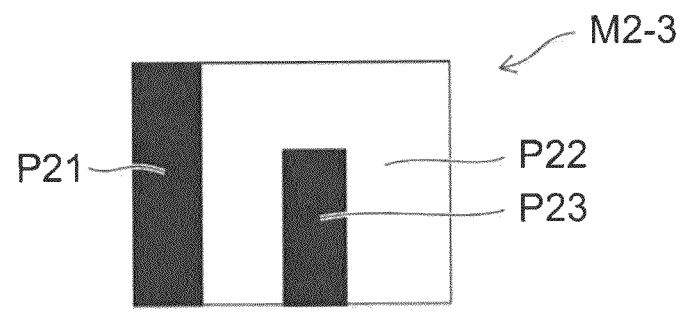

FIG. 12C shows a mask for light blocking M2-3. The mask for light blocking M2-3 has a second light blocking pattern feature P21, a light transmissive pattern feature P22, and a third light blocking pattern feature P23. The second light blocking pattern feature P21 blocks part of the interference light IL1-3 of Talbot interference formed by the mask for interference M1-2. The second light blocking pattern feature P21 blocks a part of the interference light IL1-3 where periodicity is lost, for example. The third light blocking pattern feature P23 selectively blocks other parts of the interference light IL1-3 (parts of the interference light IL1-3 not blocked by the second light blocking pattern feature P21).

Figure 12D:
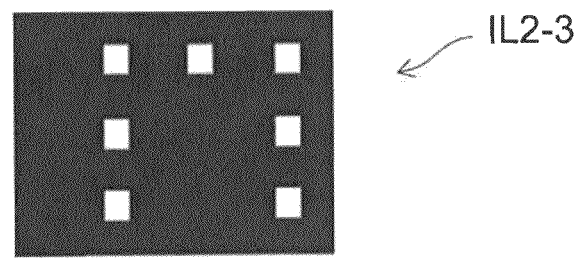

FIG. 12D shows a pattern of interference light IL2-3 applied onto an exposure object member. The pattern of the interference light IL2-3 shown in FIG. 12D is formed by the superposition of the pattern of the interference light IL1-3 produced by Talbot interference shown in FIG. 12B and the mask for light blocking M2-3 shown in FIG. 12C. That is, of the interference light IL1-3 shown in FIG. 12B, the light transmitted through the portions other than the second light blocking pattern feature P21 and the third light blocking pattern feature P23 of the mask for light blocking M2-3 shown in FIG. 12C (the light transmissive pattern feature P22) is the pattern of the interference light IL2-3 applied onto the exposure object member (FIG. 12D).

Other than the first to third examples described above, an arbitrary combination of the pattern configuration of the mask for interference M1 and the pattern configuration of the mask for light blocking M2 can be employed; thus, an arbitrary pattern of interference light can be formed and applied onto an exposure object member.

By shifting the spacing between the mask for light blocking M2 and the exposure object member by ½ of the Talbot distance $Z_T$, a pattern can be obtained in which the light and dark of the patterns of the interference lights IL1-2, IL2-2, and IL3-2 shown in FIG. 10D, FIG. 11D, and FIG. 12D are reversed.

Sixth Embodiment

Next, exposure apparatuses according to a sixth embodiment are described.

Figure 13:
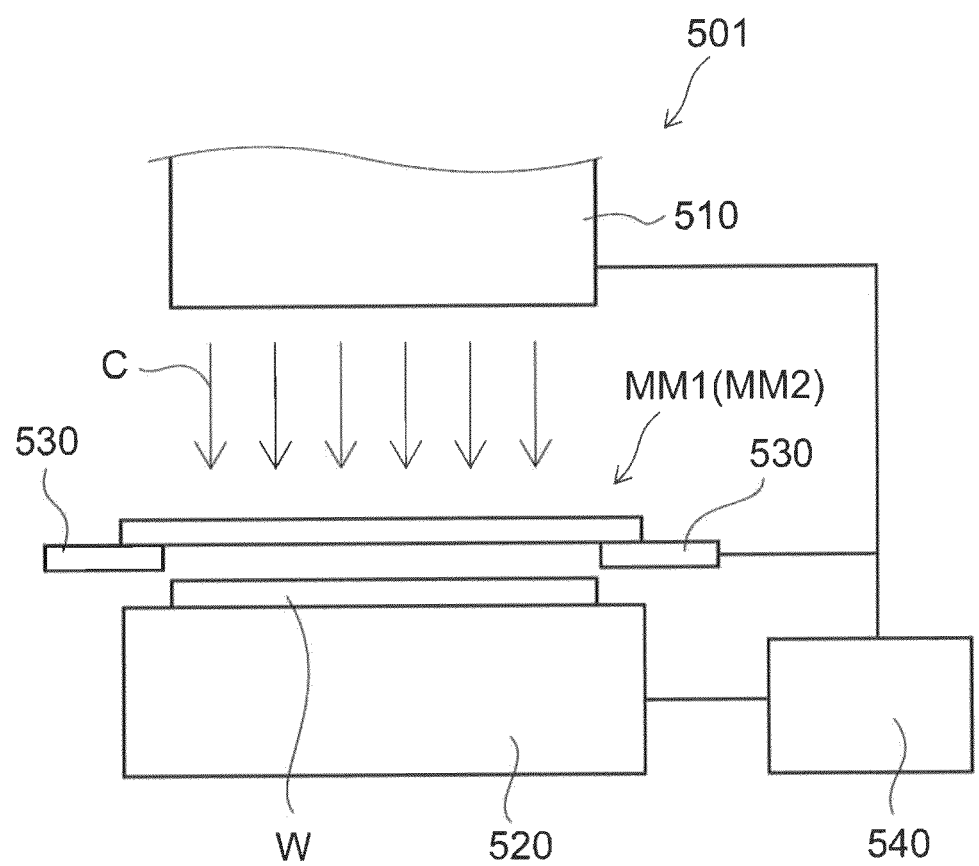
FIG. 13 and FIG. 14 are schematic views illustrating exposure apparatuses.
Figure 14:
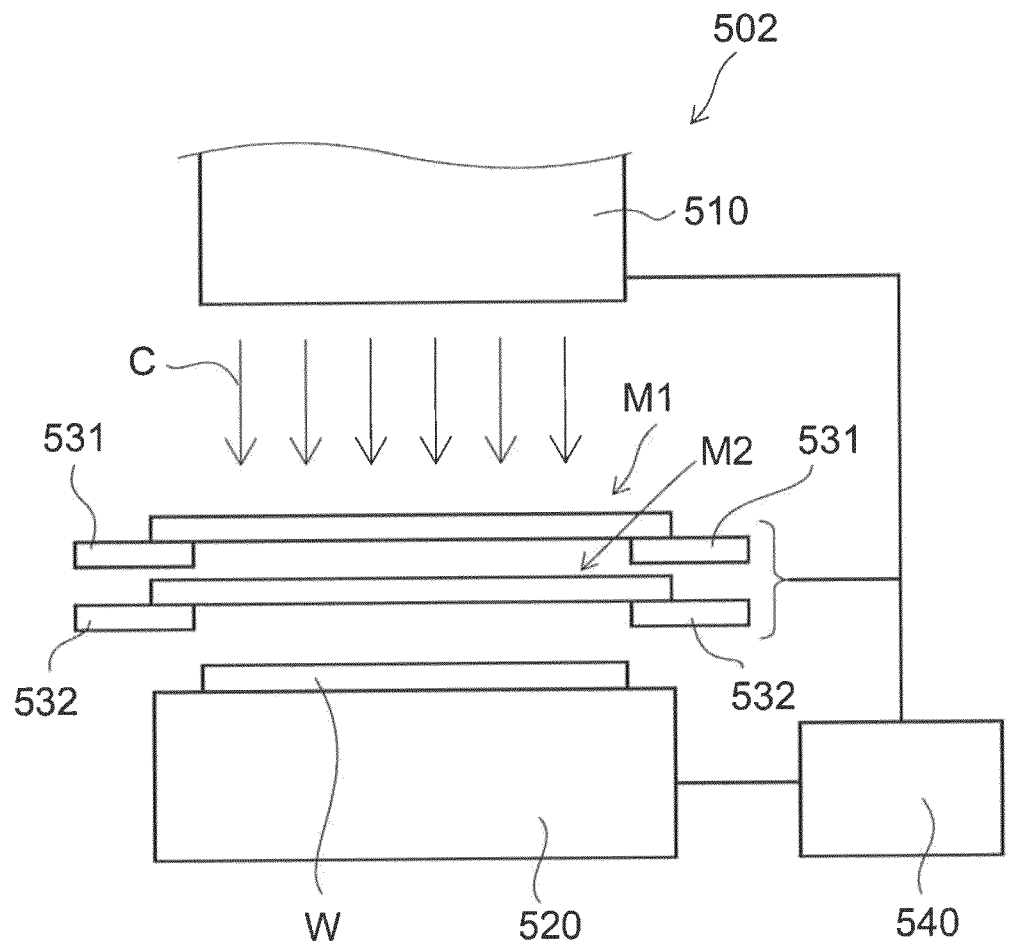

FIG. 13 and FIG. 14 are schematic views illustrating exposure apparatuses.

FIG. 13 shows an exposure apparatus 501, and FIG. 14 shows an exposure apparatus 502.

As shown in FIG. 13, the exposure apparatus 501 includes a light source 510, a stage 520, and a mask holding unit 530. The exposure apparatus 501 is a proximity exposure apparatus, for example.

The light source 510 emits light used for exposure. The light source 510 emits laser light C, for example. The laser light C is Ar excimer laser light of a wavelength of 193 nanometers (nm), for example.

The stage 520 holds an exposure object member thereon. In the example shown in FIG. 13, a wafer W is mounted as the exposure object member. The stage 520 attracts and holds the wafer W on the stage 520 by vacuum suction, for example. The stage 520 is provided movably along, for example, two axes (the X-axis and the Y-axis) along the surface of the wafer W. By moving the stage 520, the relative positional relationship between the wafer W and a mask for exposure held by the mask holding unit 530 described below is changed.

In the exposure apparatus 501, the mask for exposure MM1 having the mask pattern for interference P1 and the mask pattern for light blocking P2 is held. The mask holding unit 530 may hold the mask for exposure MM2. In the embodiment, the case of using the mask for exposure MM1 is described as an example. The mask holding unit 530 may be provided movably.

The exposure apparatus 501 further includes a control unit 540. The control unit 540 controls the light source 510, the stage 520, and the mask holding unit 530. The control unit 540 controls the timing of emission of light, the quantity of light, etc. of the light source 510. The control unit 540 controls the timing of movement, the amount of movement, etc. of the stage 520. The control unit 540 controls operations, such as holding, releasing, and as necessary moving, of the mask for exposure MM1 by the mask holding unit 530.

To perform exposure using the exposure apparatus 501, first, the wafer W is mounted on the stage 520. Next, the mask for exposure MM1 is held at the mask holding unit 530. Next, at least one of the stage 520 and the mask holding unit 530 is moved to make the alignment between the wafer W and the mask for exposure MM1. Next, light is emitted from the light source 510. The light emitted from the light source 510 becomes interference light produced by Talbot interference by means of the mask for exposure MM1. The interference light is applied to the wafer W on the stage 520. By the interference light being applied to the wafer W, a resist, for example, on the wafer W is exposed. Next, the stage 520 is moved to perform exposure on another region of the wafer W as necessary.

In the exposure apparatus 501, by using the mask for exposure MM1, exposure using interference light with good periodicity out of the interference light produced by Talbot interference can be performed. Thereby, a pattern with high accuracy is formed.

As shown in FIG. 14, the exposure apparatus 502 includes the light source 510, the stage 520, and mask holding units 531 and 532. The exposure apparatus 502 is a proximity exposure apparatus, for example. The exposure apparatus 502 includes the mask holding units 531 and 532 in place of the mask holding unit 530 of the exposure apparatus 501 shown in FIG. 13. Otherwise, the configuration is the same as that of the exposure apparatus 501.

The mask holding unit 531 holds the mask for interference M1. The mask holding unit 532 holds the mask for light blocking M2. The control unit 540 controls the mask holding units 531 and 532 individually. The control unit 540 controls operations, such as holding, releasing, and moving, of the mask for interference M1 by the mask holding unit 531. The control unit 540 controls operations, such as holding, releasing, and moving, of the mask for light blocking M2 by the mask holding unit 532. That is, the control unit 540 controls each of the mask for interference M1 and the mask for light blocking M2 independently.

To perform exposure using the exposure apparatus 502, first, the wafer W is mounted on the stage 520. Next, the mask for interference M1 is held at the mask holding unit 531, and the mask for light blocking M2 is held at the mask holding unit 532. Next, at least two of the stage 520 and the mask holding units 531 and 532 are moved to make the relative alignment between the wafer W, the mask for interference M1, and the mask for light blocking M2.

Next, light is emitted from the light source 510. The light emitted from the light source 510 becomes interference light produced by Talbot interference by means of the mask for interference M1. Part of the interference light is blocked by the mask for light blocking M2. The other parts of the interference light not blocked by the mask for light blocking M2 are applied to the wafer W on the stage 520. By the interference light being applied to the wafer W, a resist, for example, on the wafer W is exposed. Next, the stage 520 and the mask holding units 531 and 532 are moved to perform exposure as necessary.

In the exposure apparatus 502, by controlling the movements of the stage 520 and the mask holding units 531 and 532, one of the movements based on the positional relationships of items 1 to 3 described above is performed. That is, the exposure apparatus 502 is an apparatus that enables exposure accompanied by movement based on the positional relationships of items 1 to 3 described above.

By using the exposure apparatus 502, exposure using interference light with good periodicity out of the interference light produced by Talbot interference can be performed. Thereby, a pattern with high accuracy is formed. By the movement based on the positional relationships of items 1 to 3 described above, a pattern of a desired configuration can be formed with good accuracy.

In the exposure apparatuses 501 and 502 mentioned above, the height of the stage 520 may be movable. In this case, the height of the stage 520 may be moved to adjust the spacing between the mask for exposure MM1 and the wafer W and the spacing between the mask for light blocking M2 and the wafer W; thereby, it can be selected whether self-produced images are applied onto the wafer W or reversed images are applied onto the wafer W.

A high refractive index liquid may be interposed between the mask for exposure MM1 and the wafer W and between the mask for light blocking M2 and the wafer W. In this case, the exposure apparatuses 501 and 502 are immersion proximity exposure apparatuses.

As described above, the pattern formation method, the mask for exposure, and the exposure apparatus according to the embodiment can form a pattern with high accuracy by exposure using Talbot interference.

Hereinabove, embodiments and modification examples thereof are described. However, the invention is not limited to these examples. For example, one skilled in the art may appropriately make additions, removals, and design modifications of components to the embodiments or the modification examples described above, and may appropriately combine features of the embodiments; such modifications also are included in the scope of the invention to the extent that the spirit of the invention is included.

The pattern formation method, the mask for exposure, and the exposure apparatus according to the embodiment can be used not only for the formation of a fine pattern of a semiconductor device, but also for the fabrication of various devices, such as a MEMS (micro-electro-mechanical system), in which pattern formation using photolithography technology is performed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern formation method comprising:
   preparing a mask pattern for interference, the mask pattern for interference being arranged periodically a plurality of light transmissive portions;
   producing Talbot interference based on a transmitted light, the transmitted light being transmitted through the light transmissive portions by applying a light to the mask pattern for interference; and
   forming a pattern by blocking a part of interference light produced by the Talbot interference by means of a mask pattern for light blocking and applying another part of the interference light transmitted through the mask pattern for light blocking to an exposure object member.

2. The pattern formation method according to claim 1, wherein the part of the interference light includes at least one of a plurality of image formation portions included in the interference light.

3. The pattern formation method according to claim 1, wherein the part of the interference light includes one on an outermost side of a plurality of image formation portions included in the interference light.

4. The pattern formation method according to claim 1, wherein the mask pattern for light blocking is disposed between an image formation portion and a reversed image formation portion in a direction away from the mask pattern for interference, the image formation portion and the reversed image formation portion being included in the interference light.

5. The pattern formation method according to claim 1, wherein a spacing between the mask pattern for light blocking and the exposure object member is less than a Talbot distance based on the Talbot interference.

6. The pattern formation method according to claim 1, wherein the forming a pattern includes changing relative positions of the mask pattern for interference and the mask pattern for light blocking.

7. The pattern formation method according to claim 1, wherein
the mask pattern for light blocking has a first light blocking portion and a second light blocking portion, the first light blocking portion being configured to block the part of the interference light, the second light blocking portion being configured to selectively block the another part of the interference light,
the forming a pattern including applying light transmitted through other than the first light blocking portion and the second light blocking portion of the mask pattern for light blocking to the exposure object member.

8. A mask for exposure comprising:
a substrate having a first surface and a second surface on an opposite side to the first surface, the substrate being configured to transmit light;
a mask pattern for interference provided on the first surface of the substrate, the mask pattern for interference having a plurality of light transmissive portions arranged periodically, and the mask pattern for interference being configured to generate interference light produced by Talbot interference; and
a mask pattern for light blocking provided on the second surface of the substrate, the mask pattern for light blocking being provided so as to overlap with part of the mask pattern for interference as viewed in a direction connecting the first surface and the second surface, and the mask pattern for light blocking being configured to block a part of the interference light.

9. The mask for exposure according to claim 8, wherein the mask pattern for light blocking blocks at least one of a plurality of image formation portions included in the interference light.

10. The mask for exposure according to claim 8, wherein the mask pattern for light blocking blocks at least one on an outermost side of a plurality of image formation portions included in the interference light.

11. The mask for exposure according to claim 8, wherein the mask pattern for light blocking is disposed between an image formation portion and a reversed image formation portion, the image formation portion and the reversed image formation portion being included in the interference light in a direction away from the mask pattern for interference.

12. The mask for exposure according to claim 8, wherein the mask pattern for light blocking has:
a first light blocking portion configured to block the part of the interference light; and
a second light blocking portion configured to selectively block the another part of the interference light.

13. A mask for exposure comprising:
a substrate having a first surface and a second surface on an opposite side to the first surface, the substrate being configured to transmit light;
a mask pattern for interference provided on the second surface of the substrate, the mask pattern for interference having a plurality of light transmissive portions arranged periodically, and the mask pattern for interference being configured to generate interference light produced by Talbot interference;
a mask pattern for light blocking provided on the second surface side of the substrate, the mask pattern for light blocking being provided so as to overlap with part of the mask pattern for interference as viewed in a direction connecting the first surface and the second surface, and the mask pattern for light blocking being configured to block a part of the interference light; and
an intermediate film provided between the mask pattern for interference and the mask pattern for light blocking, the intermediate film being configured to transmit the light.

14. The mask for exposure according to claim 13, wherein the mask pattern for light blocking blocks at least one of a plurality of image formation portions included in the interference light.

15. The mask for exposure according to claim 13, wherein the mask pattern for light blocking blocks at least one on an outermost side of a plurality of image formation portions included in the interference light.

16. The mask for exposure according to claim 13, wherein the mask pattern for light blocking is disposed between an image formation portion and a reversed image formation portion, the image formation portion and the reversed image formation portion being included in the interference light in a direction away from the mask pattern for interference.

17. The mask for exposure according to claim 13, wherein the mask pattern for light blocking has:
a first light blocking portion configured to block the part of the interference light; and
a second light blocking portion configured to selectively block the another part of the interference light.

18. The mask for exposure according to claim 13, wherein a thickness of the intermediate film is such a thickness that a spacing between the mask pattern for interference and the mask pattern for light blocking is set not less than ¼ and not more than ¾ of a Talbot distance based on the Talbot interference.

19. An exposure apparatus comprising:
a light source configured to emit light;
a stage configured to hold an exposure object member thereon; and
a mask holding unit configured to hold a mask for exposure, the mask for exposure having a mask pattern for interference and a mask pattern for light blocking, the mask pattern for interference being configured to generate interference light produced by Talbot interference, the mask pattern for light blocking being configured to block a part of the interference light,
the exposure apparatus being configured to apply the light emitted from the light source to the mask for exposure and apply another part of the interference light transmitted through the mask for light blocking to the exposure object member.

* * * * *